United States Patent
Tsai et al.

(10) Patent No.: US 11,705,102 B2
(45) Date of Patent: Jul. 18, 2023

(54) METHOD AND DEVICE FOR ELIMINATING UNSTABLE NOISE

(71) Applicant: REALTEK SEMICONDUCTOR CORP., Hsinchu (TW)

(72) Inventors: Chung-Hang Tsai, Hsinchu (TW); Hui-Chun Lien, Hsinchu (TW); Yi-Kuei Chen, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 24 days.

(21) Appl. No.: 17/564,787

(22) Filed: Dec. 29, 2021

(65) Prior Publication Data

US 2022/0215825 A1    Jul. 7, 2022

(30) Foreign Application Priority Data

Jan. 4, 2021   (TW) .................. 110100185

(51) Int. Cl.
*G10K 11/178* (2006.01)
*H03F 1/30* (2006.01)
(Continued)

(52) U.S. Cl.
CPC .. *G10K 11/17825* (2018.01); *G10K 11/17853* (2018.01); *H03F 1/305* (2013.01); *H03G 3/348* (2013.01); *H04R 3/02* (2013.01); *H04R 29/00* (2013.01); *G10K 2210/1082* (2013.01); *H03F 2200/03* (2013.01); *H04R 3/007* (2013.01)

(58) Field of Classification Search
CPC ....... G10K 11/17825; G10K 11/17853; G10K 2210/1082; H03F 1/305; H03F 2200/03; H03F 2203/45101; H03F 2203/21112; H04R 3/002; H04R 3/007; H04R 3/02; H04R 3/04; H04R 29/00; H04R 29/004;
(Continued)

(56) References Cited

U.S. PATENT DOCUMENTS 5,481,617 A * 1/1996 Bjerre .................... H03G 5/165
                                                        381/98
2004/0239418 A1* 12/2004 Inagaki .................. H03F 1/305
                                                        381/94.5
(Continued)

*Primary Examiner* — Vivian C Chin
*Assistant Examiner* — Douglas J Suthers
(74) *Attorney, Agent, or Firm* — Birch, Stewart, Kolasch & Birch, LLP

(57) ABSTRACT

A method for eliminating unstable noise is provided and applicable to a sound recording device and implemented by a codec. The method includes: activating the sound recording device to start recording; setting a suppression duration and a cutoff frequency switching duration according to unstable noise and a DC offset value of the sound recording device; processing a front-end audio of a recorded sound by a filter having a first cutoff frequency to make the unstable noise in the front-end audio quickly converge, and outputting a filtered audio signal; suppressing the filtered audio signal according to the suppression duration to eliminate the unstable noise; and adjusting the first cutoff frequency of the filter to a second cutoff frequency according to the cutoff frequency switching duration, where the first cutoff frequency is greater than the second cutoff frequency. A device for eliminating unstable noise is also provided.

14 Claims, 4 Drawing Sheets

(51) Int. Cl.
    *H03G 3/34*     (2006.01)
    *H04R 3/02*     (2006.01)
    *H04R 29/00*     (2006.01)
    *H04R 3/00*     (2006.01)

(58) Field of Classification Search
    CPC ................ H04S 2400/15; H03G 3/348; H03G 2201/208
    USPC ............................................ 381/72, 55, 94.8
    See application file for complete search history.

(56) References Cited

U.S. PATENT DOCUMENTS

| | | | | |
|---|---|---|---|---|
| 2012/0207315 A1* | 8/2012 | Kimura | ................ | G10L 21/034 381/94.3 |
| 2019/0149920 A1* | 5/2019 | Putzeys | .................... | H04R 3/06 381/55 |

* cited by examiner

METHOD AND DEVICE FOR ELIMINATING UNSTABLE NOISE

CROSS-REFERENCE TO RELATED APPLICATION

This non-provisional application claims priority under 35 U.S.C. § 119(a) to Patent Application No. 110100185 filed in Taiwan, R.O.C. on Jan. 4, 2021, the entire contents of which are hereby incorporated by reference.

BACKGROUND

Technical Field

The invention relates to an audio processing technology, and in particular, to a method and device for eliminating unstable noise.

Related Art

For a general digital microphone in recording, when the microphone is just activated or when switching into a mode, the microphone often produces unstable noise, such as pop noise, which leads to poor sound quality and hurts user experience. Conventional techniques employ software for processing an audio, where the software compensates a high pass filter, so that a DC value converges faster, and a volume mask is used in coordination to make initial pop noise unperceivable due to a lower volume. However, when the microphone generates a large DC value, such technique cannot guarantee that the applied volume mask is able to render the noise inaudible, and a high pass filter that maintains a high cutoff frequency (−3 dB corner) also filters out part of audio bandwidth (audio BW), resulting in audio distortion.

SUMMARY

In view of this, the invention provides a method for eliminating unstable noise, which is applicable to a sound recording device and implemented by a codec. The method for eliminating unstable noise includes: activating the sound recording device to start recording; setting a suppression duration and a cutoff frequency switching duration according to unstable noise and a DC offset value of the sound recording device; processing a front-end audio of a recorded sound by a filter having a first cutoff frequency to make the unstable noise in the front-end audio quickly converge, and outputting a filtered audio signal; suppressing the filtered audio signal according to the suppression duration to eliminate the unstable noise; and adjusting the first cutoff frequency of the filter to a second cutoff frequency according to the cutoff frequency switching duration, where the first cutoff frequency is greater than the second cutoff frequency.

The invention also provides a device, which includes a sound recording device and a codec, where the codec is electrically coupled to the sound recording device. The codec includes a filter, an audio signal path, and a suppression circuit. The filter is electrically coupled to the sound recording device and the audio signal path. When the sound recording device is activated to start recording, the filter processes a front-end audio of a recorded sound by using a first cutoff frequency and outputs a filtered audio signal, and then the filter adjusts the first cutoff frequency to a second cutoff frequency according to a cutoff frequency switching duration, where the first cutoff frequency is greater than the second cutoff frequency. The audio signal path is electrically coupled to the suppression circuit for the transmission of the filtered audio signal to the suppression circuit, and the suppression circuit suppresses the filtered audio signal according to a suppression duration to eliminate unstable noise in the front-end audio.

According to some embodiments, the step of activating the sound recording device is performed when the sound recording device is powered on or when the sound recording device performs mode switching.

According to some embodiments, before the step of setting the suppression duration and the cutoff frequency switching duration according to the unstable noise and the DC offset value of the sound recording device, the method further includes: detecting the unstable noise and the DC offset value of the sound recording device by using a detection circuit.

According to some embodiments, the detection circuit further transmits the unstable noise and the DC offset value to a decision circuit, so that the decision circuit sets the suppression duration and the cutoff frequency switching duration according to the unstable noise and the DC offset value.

According to some embodiments, in the step of setting the suppression duration and the cutoff frequency switching duration according to the unstable noise and the DC offset value of the sound recording device, the decision circuit also sets the first cutoff frequency according to the DC offset value.

According to some embodiments, the second cutoff frequency is a cutoff frequency of the sound recording device in normal operation.

According to some embodiments, the sound recording device is a digital microphone.

In summary, by using a hardware control method, the invention enables unstable noise generated by a sound recording device during recording to converge faster and be suppressed, so as to eliminate the unstable noise (transient change) in a front-end audio of the sound recording device. In addition, in the invention, a suppression duration, a cutoff frequency switching duration, and a first cutoff frequency can be dynamically adjusted and set according to the unstable noise and a DC offset value of the sound recording device to adapt to the transient change of the sound recording device during recording and reduce the duration of recording distortion, so as to achieve the effect of small distortion.

DETAILED DESCRIPTION

Figure 1:
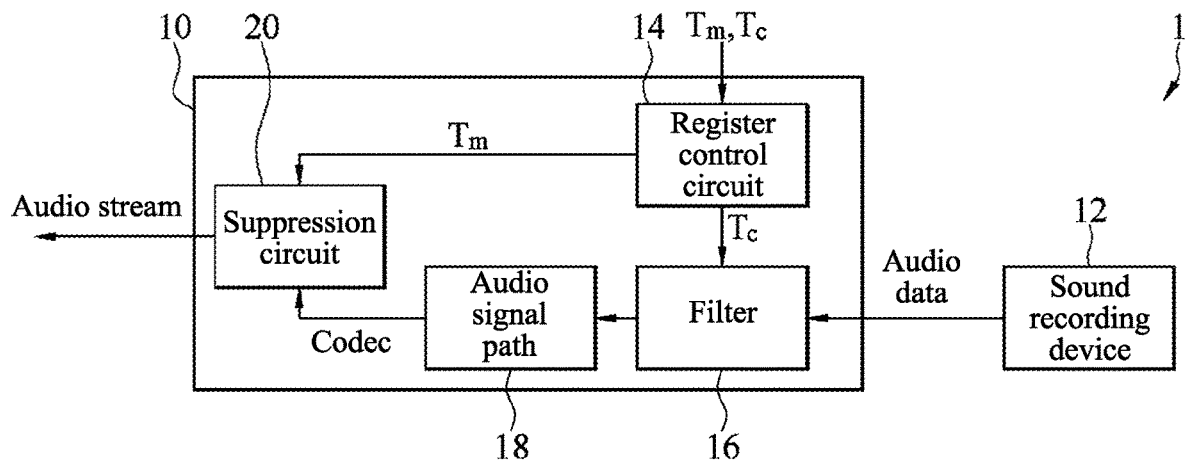
FIG. 1 is a block diagram of a device for eliminating unstable noise according to an embodiment of the invention.

FIG. 1 is a block diagram of a device for eliminating unstable noise according to an embodiment of the invention. Referring to FIG. 1, the device 1 for eliminating unstable noise includes a codec 10 and a sound recording device 12, and the recording device 12 can also be called a transducer. The codec 10 is electrically coupled to the sound recording device 12, and the codec 10 includes a register control circuit 14, a filter 16, an audio signal path 18, and a suppression circuit 20. The filter 16 is electrically coupled to the sound recording device 12, the register control circuit 14, and the audio signal path 18, and the suppression circuit 20 is electrically coupled to the register control circuit 14 and the audio signal path 18, so that the filter 16 can be used to filter an audio signal, and the suppression circuit 20 can be used to suppress the audio signal in a specific duration.

In an embodiment, the sound recording device 12 is any electroacoustic conversion device, such as a digital microphone. In another embodiment, the sound recording device 12 may alternatively be composed of an analog microphone and an analog-to-digital converter.

In an embodiment, the filter 16 is a high pass filter.

Figure 2:
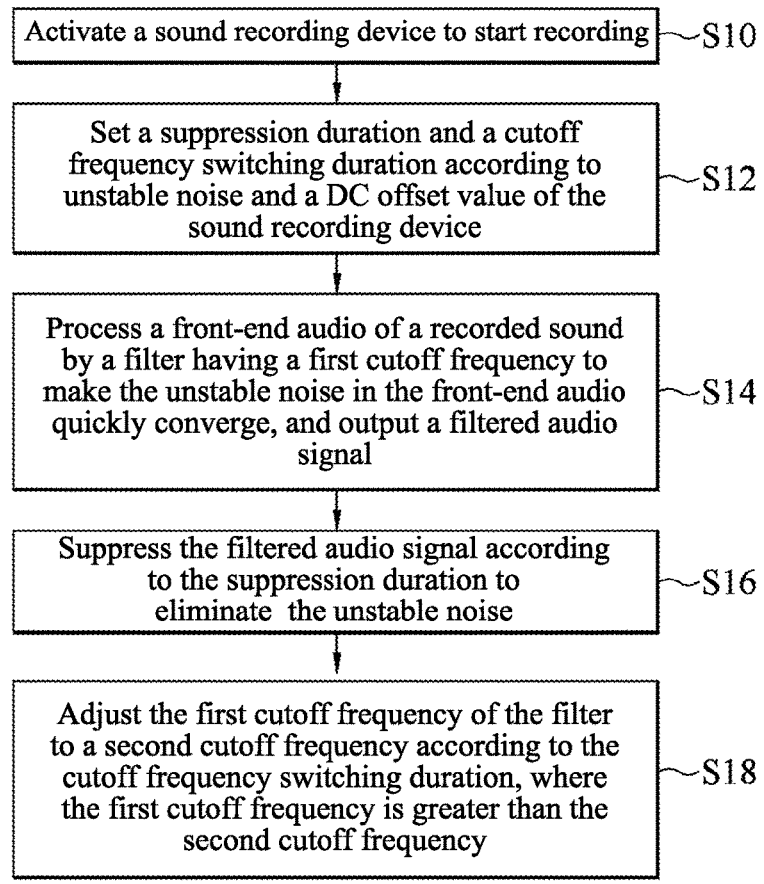
FIG. 2 is a schematic flowchart of a method for eliminating unstable noise according to an embodiment of the invention.

Referring to both FIG. 1 and FIG. 2, the method for eliminating unstable noise is applicable to the sound recording device 12 and is implemented by the codec 10. The method for eliminating unstable noise includes: as shown in step S10, activating the sound recording device 12 to start recording, where the activation of the sound recording device 12 can be performed when the sound recording device 12 is powered on or when the sound recording device 12 performs mode switching, in response to different transient changes generated by the sound recording device 12. Because features of the sound recording device 12 are known, unstable noise and a DC offset value corresponding to the sound recording device 12 can be known. As shown in step S12, software or firmware may be applied for setting a suppression duration Tm and a cutoff frequency switching duration Tc according to the unstable noise and the DC offset value of the sound recording device 12. The suppression duration Tm and the cutoff frequency switching duration Tc can be stored in the register control circuit 14, and the register control circuit 14 transmits the suppression duration Tm to the suppression circuit 20 and transmits the cutoff frequency switching duration Tc to the filter 16. As shown in step S14, when the sound recording device 12 transmits recorded audio data to the filter 16, the filter 16 filters a front-end audio of the recorded sound by using a relatively high first cutoff frequency, so that unstable noise in the front-end audio can quickly converge, and the filter 16 outputs a filtered audio signal. The filtered audio signal processed by the filter 16 is transmitted to the suppression circuit 20 through the audio signal path 18. As shown in step S16, the suppression circuit 20 suppresses the filtered audio signal according to the suppression duration Tm and holds for the suppression duration Tm to eliminate the unstable noise. Finally, as shown in step S18, the register control circuit 14 adjusts the cutoff frequency of the filter 16 from the first cutoff frequency to a second cutoff frequency according to the cutoff frequency switching duration Tc, where the first cutoff frequency is greater than the second cutoff frequency, and the second cutoff frequency is a cutoff frequency of the sound recording device 12 in normal operation. Therefore, the relatively high first cutoff frequency can be used to make the unstable noise in the front-end audio quickly converge. In other words, at the beginning of recording, the filter 16 works at a relatively high first cutoff frequency, and after the cutoff frequency switching duration Tc, the filter 16 is adjusted from the initially relatively high first cutoff frequency back to the normal second cutoff frequency, and filters the subsequent audio data by using the normal second cutoff frequency. The processed audio signal passes sequentially through the audio signal path 18 and the suppression circuit 20, so that the codec 10 outputs an audio stream. When the audio signal passes through the suppression circuit 20, because the suppression duration Tm has passed, the suppression circuit 20 stops the suppression. Therefore, the audio signal directly passes through the suppression circuit 20 without being suppressed, and the audio stream is outputted normally.

In an embodiment, the unstable noise may be, but is not limited to, DC pop noise.

In an embodiment, when the suppression duration Tm and the cutoff frequency switching duration Tc are set in step S12, the initial first cutoff frequency of the filter 16 can also be set according to the DC offset value of the sound recording device 12, so that the relatively high first cutoff frequency can be used to make the unstable noise (transient change) of the front-end audio quickly converge.

In an embodiment, in step S16, a muting method can alternatively be used in the suppression step to eliminate the unstable noise. That is, the suppression circuit 20 can mute the filtered audio signal according to the suppression duration Tm and continue for the suppression duration Tm to eliminate the unstable noise.

Figure 3:
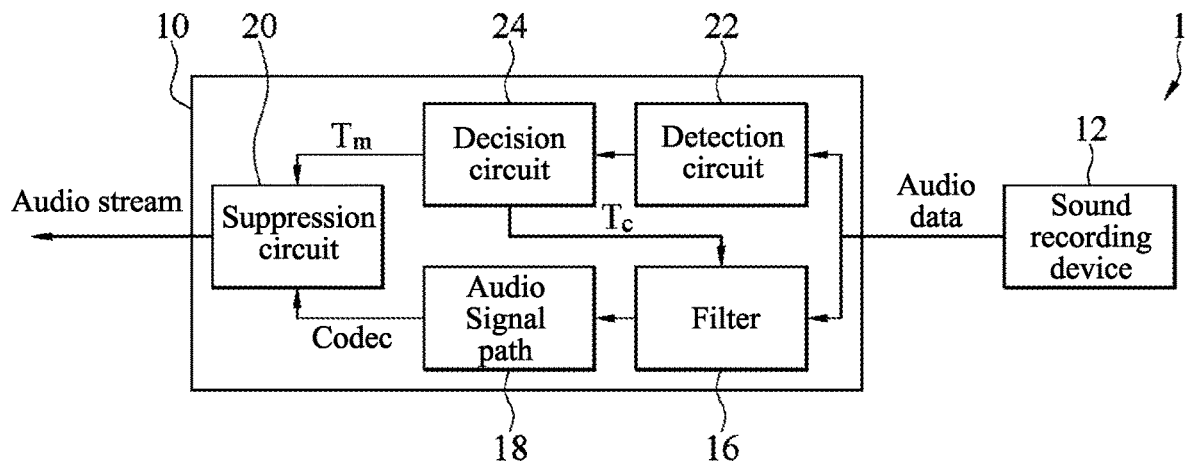
FIG. 3 is a block diagram of a device for eliminating unstable noise according to another embodiment of the invention.

FIG. 3 is a block diagram of a device for eliminating unstable noise according to another embodiment of the invention. Referring to FIG. 3, a device 1 for eliminating unstable noise includes a codec 10 and a sound recording device 12. The codec 10 is electrically coupled to the sound recording device 12, and the codec 10 includes a detection circuit 22, a decision circuit 24, a filter 16, an audio signal path 18, and a suppression circuit 20. The detection circuit 22 is electrically coupled to the sound recording device 12 and the decision circuit 24. The filter 16 is electrically coupled to the sound recording device 12, the decision circuit 24, and the audio signal path 18. The suppression circuit 20 is electrically coupled to the decision circuit 24 and the audio signal path 18. In the codec 10, the detection circuit 22 detects unstable noise and a DC offset value corresponding to the sound recording device 12, and transmits the unstable noise and the DC offset value to the decision circuit 24, so that the decision circuit 24 determines a suppression duration Tm and a cutoff frequency switching duration Tc according to the unstable noise and the DC offset value, and transmits Tm and Tc to the suppression circuit 20 and the filter 16 respectively. Then the suppression circuit 20 performs suppression according to the suppression duration Tm, and the filter 16 switches a cutoff frequency according to the cutoff frequency switching duration Tc.

Figure 4:
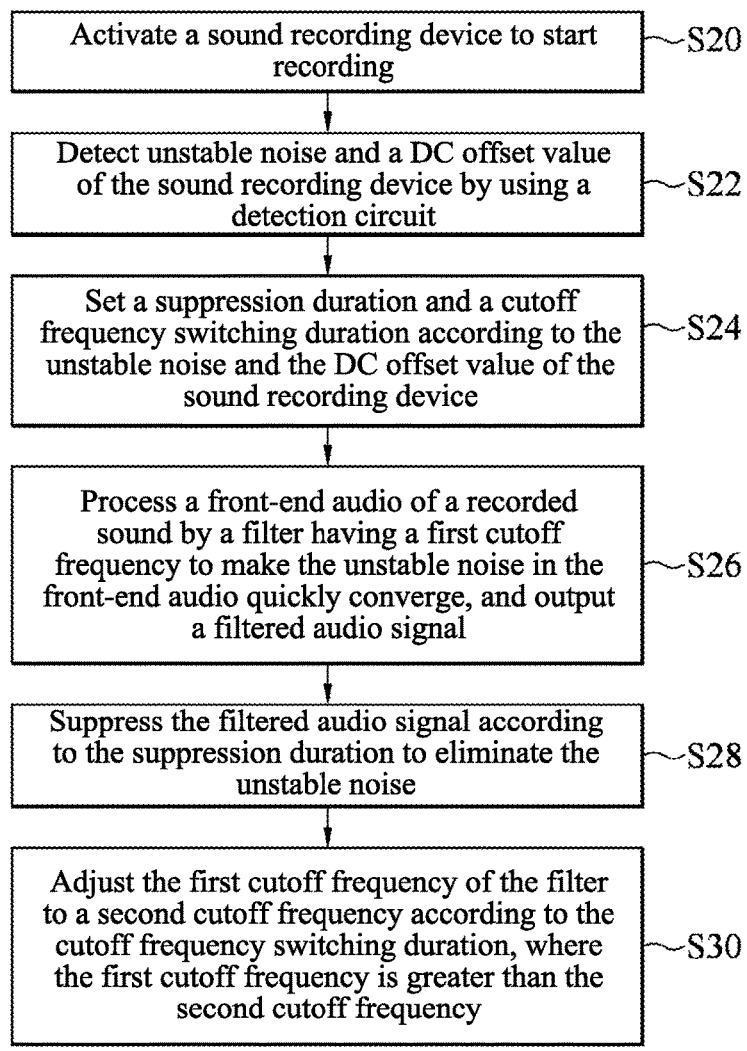
FIG. 4 is a schematic flowchart of a method for eliminating unstable noise according to another embodiment of the invention.

Referring to both FIG. 3 and FIG. 4, the method for eliminating unstable noise is applicable to the sound recording device 12 and is implemented by the codec 10. This method includes: as shown in step S20, activating the sound recording device 12 to start recording when the sound recording device 12 is powered on or performs mode switching. As shown in step S22, the detection circuit 22 detects unstable noise and a DC offset value of the sound recording device 12, and transmits the detected unstable noise and DC offset value to the decision circuit 24. As shown in step S24, the decision circuit 24 sets the suppression duration Tm and the cutoff frequency switching duration Tc according to the unstable noise and the DC offset value, and transmits the suppression duration Tm to the suppression circuit 20 and transmits the cutoff frequency switching duration Tc to the filter 16. As shown in step S26, when the sound recording device 12 transmits recorded audio data to the filter 16, the filter 16 filters a front-end audio of the recorded sound by using a relatively high first cutoff frequency, so that the unstable noise in the front-end audio can quickly converge, and the filter 16 outputs a filtered audio signal. The filtered audio signal processed by the filter 16 is transmitted to the suppression circuit 20 through the audio signal path 18. As shown in step S28, the suppression circuit 20 suppresses the filtered audio signal according to the received suppression duration Tm and continues for the suppression duration Tm to eliminate the unstable noise. Finally, as shown in step S30, the decision circuit 24 adjusts the cutoff frequency of the filter 16 from a relatively high first cutoff frequency to a normal second cutoff frequency according to the cutoff frequency switching duration Tc. After the cutoff frequency switching duration Tc, the filter 16 is adjusted from the initially relatively high first cutoff frequency back to the normal second cutoff frequency, and filters the subsequent audio data by using the normal second cutoff frequency. The processed audio signal passes sequentially through the audio signal path 18 and the suppression circuit 20, so as to output an audio stream. When the audio signal passes through the suppression circuit 20, because the suppression duration Tm has passed, the suppression circuit 20 stops the suppression. Therefore, the audio signal directly passes through the suppression circuit 20 without being suppressed, and the audio stream is outputted normally.

In an embodiment, when the decision circuit 24 sets the suppression duration Tm and the cutoff frequency switching duration Tc in step S24, the decision circuit 24 can also set the initial first cutoff frequency of the filter 16 according to the DC offset value of the sound recording device 12, so that the relatively high first cutoff frequency can be used to make the unstable noise of the front-end audio quickly converge.

In an embodiment, in step S28, a muting method can alternatively be used in the suppression step to eliminate the unstable noise. That is, the suppression circuit 20 can mute the filtered audio signal according to the suppression duration Tm and continue for the suppression duration Tm to eliminate the unstable noise.

In summary, in the operating modes shown in FIG. 3 and FIG. 4, the detection circuit 22 can be used to automatically detect the unstable noise and the DC offset value contributed by the sound recording device 12 and dynamically adjust the suppression duration Tm and the cutoff frequency switching duration Tc. In this case, the system is more adaptable to different sound recording devices 12, so as to eliminate unstable noise (transient change) generated by a sound recording device 12 during recording.

In an embodiment, the codec 10 can be built in a host (not shown), and the sound recording device 12 can be plugged into the host to form an electrical connection with the codec 10 to eliminate unstable noise by using the codec 10. The host can be, but is not limited to, a notebook computer, a tablet computer, or a personal computer.

Figure 5:
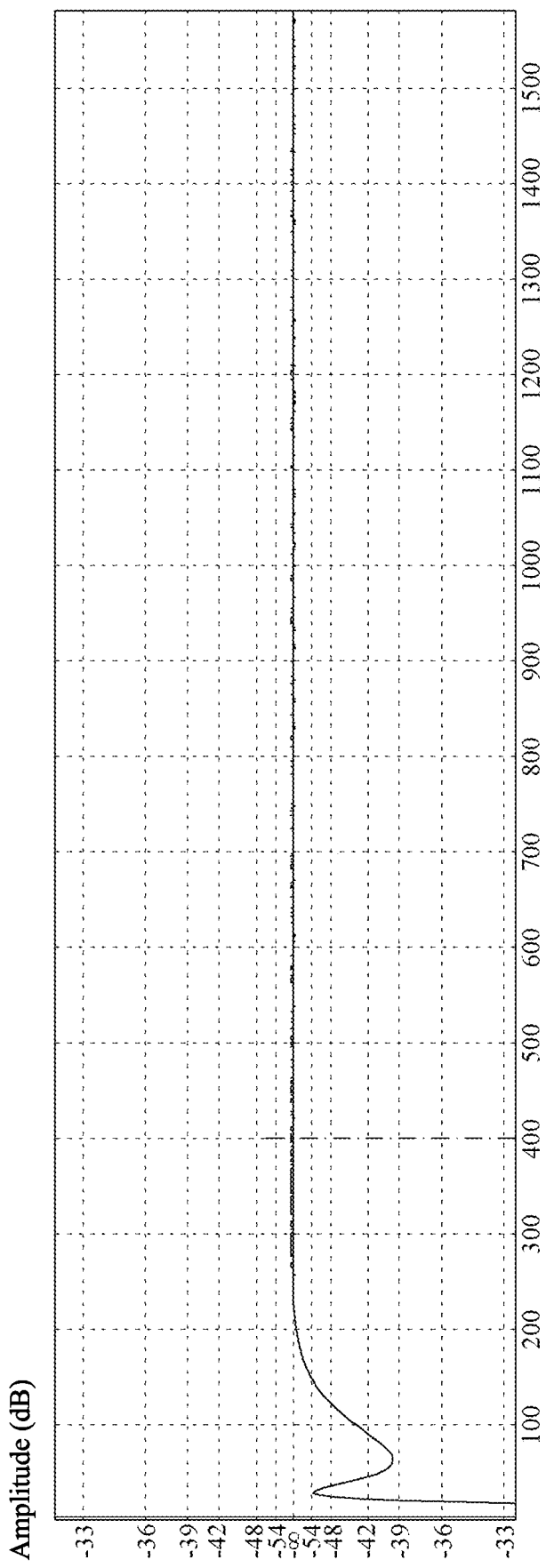
FIG. 5 is a schematic diagram of an audio signal on which the method for eliminating unstable noise of the invention is not performed.
Figure 6:
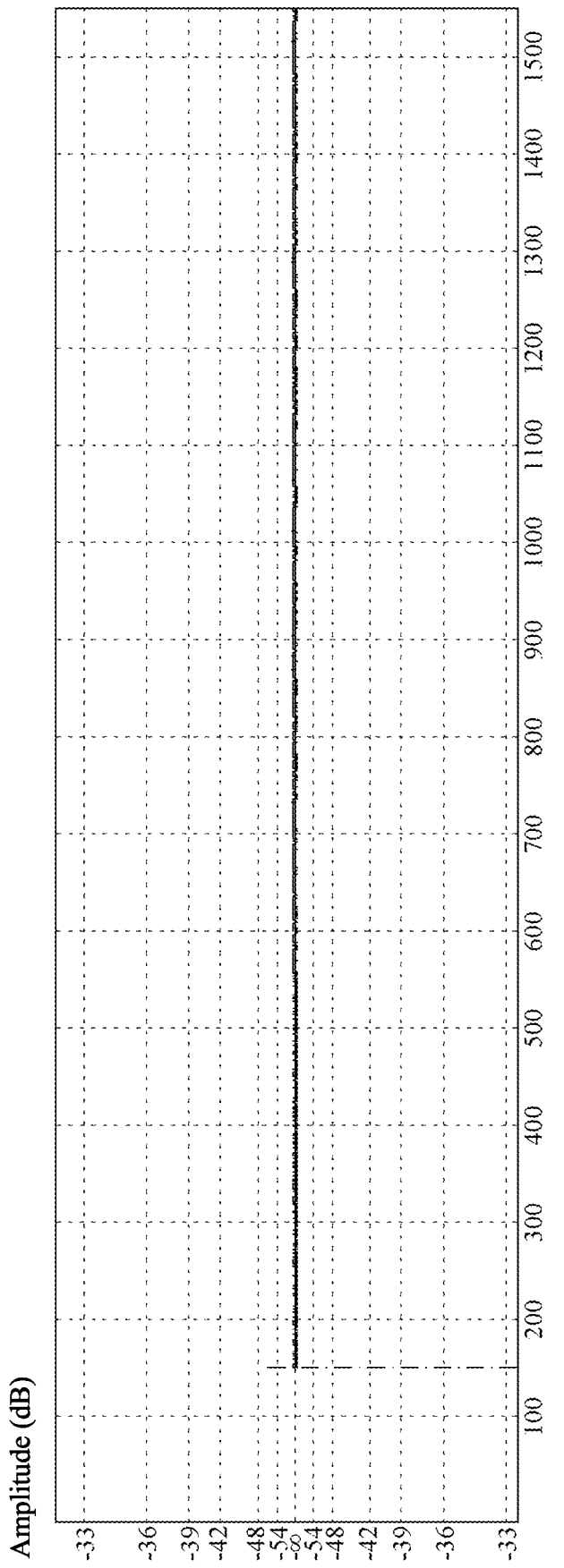
FIG. 6 is a schematic diagram of an audio signal on which the method for eliminating unstable noise of the invention has been performed.

Referring to both FIG. 5 and FIG. 6, before the method for eliminating unstable noise of the invention is used, as shown in FIG. 5, after the sound recording device is activated, the audio signal starts from 0 seconds. At this duration, there is unstable noise in a front-end audio of an audio signal, and the DC signal (audio signal) is not stabilized until 400 milliseconds. In contrast, after the method for eliminating unstable noise of the invention is applied, as shown in FIG. 6, after the sound recording device is activated, the audio signal also starts from 0 seconds, but unstable noise in a front-end audio of an audio signal has already been suppressed, and the DC signal (audio signal) is already stable at 150 milliseconds. Therefore, the total duration required for stabilization is greatly reduced.

Therefore, by using a hardware control method, the invention enables unstable noise generated by a sound recording device during recording to converge faster and be suppressed, so as to eliminate the unstable noise (transient change) in a front-end audio of the sound recording device. In addition, in the invention, a suppression duration, a cutoff frequency switching duration, and a first cutoff frequency can be dynamically adjusted and set according to the unstable noise and a DC offset value of the sound recording device to adapt to the transient change of the sound recording device during recording and reduce the duration of recording distortion, so as to achieve the effect of small distortion.

Although the invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A method for eliminating unstable noise, applicable to a sound recording device and implemented by a codec, the method for eliminating unstable noise comprising:
   activating the sound recording device to start recording;
   setting a suppression duration and a cutoff frequency switching duration according to unstable noise and a DC offset value of the sound recording device;
   processing a front-end audio of a recorded sound by a filter having a first cutoff frequency to make the unstable noise in the front-end audio quickly converge, and outputting a filtered audio signal;
   suppressing the filtered audio signal according to the suppression duration to eliminate the unstable noise; and
   adjusting the first cutoff frequency of the filter to a second cutoff frequency according to the cutoff frequency switching duration, wherein the first cutoff frequency is greater than the second cutoff frequency.

2. The method for eliminating unstable noise according to claim 1, wherein the step of activating the sound recording device is performed when the sound recording device is powered on or when the sound recording device performs mode switching.

3. The method for eliminating unstable noise according to claim 1, wherein before the step of setting the suppression duration and the cutoff frequency switching duration according to the unstable noise and the DC offset value of the sound recording device, the method further comprises: detecting the unstable noise and the DC offset value of the sound recording device by using a detection circuit.

4. The method for eliminating unstable noise according to claim 3, wherein the detection circuit transmits the unstable noise and the DC offset value to a decision circuit, so that the decision circuit sets the suppression duration and the cutoff frequency switching duration according to the unstable noise and the DC offset value.

5. The method for eliminating unstable noise according to claim 4, wherein in the step of setting the suppression duration and the cutoff frequency switching duration according to the unstable noise and the DC offset value of the sound recording device, the decision circuit also sets the first cutoff frequency according to the DC offset value.

6. The method for eliminating unstable noise according to claim 1, wherein the step of setting the suppression duration and the cutoff frequency switching duration according to the unstable noise and the DC offset value of the sound recording device further comprises: setting the first cutoff frequency according to the DC offset value.

7. The method for eliminating unstable noise according to claim 1, wherein the second cutoff frequency is a cutoff frequency of the sound recording device in normal operation.

8. The method for eliminating unstable noise according to claim 1, wherein the sound recording device is a digital microphone.

9. A device, comprising:
a sound recording device; and
a codec electrically coupled to the sound recording device, the codec comprising:
a filter electrically coupled to the sound recording device, wherein when the sound recording device is activated to start recording, the filter processes a front-end audio of a recorded sound by using a first cutoff frequency and outputs a filtered audio signal; and the filter adjusts the first cutoff frequency to a second cutoff frequency according to a cutoff frequency switching duration, the first cutoff frequency being greater than the second cutoff frequency;
an audio signal path electrically coupled to the filter, to transmit the filtered audio signal; and
a suppression circuit electrically coupled to the audio signal path and receiving the filtered audio signal, the suppression circuit suppressing the filtered audio signal according to a suppression duration.

10. The device according to claim 9, wherein the codec further comprises a register control circuit, which is electrically coupled to the suppression circuit and the filter to store the suppression duration and the cutoff frequency switching duration that are set in advance, and respectively transmits the suppression duration to the suppression circuit and transmits the cutoff frequency switching duration to the filter.

11. The device according to claim 9, wherein the codec further comprises a detection circuit, which is electrically coupled to the sound recording device to detect unstable noise and a DC offset value of the sound recording device; and a decision circuit, which is electrically coupled to the detection circuit, the suppression circuit, and the filter, the decision circuit setting the suppression duration and the cutoff frequency switching duration according to the unstable noise and the DC offset value, and respectively transmitting the suppression duration to the suppression circuit and transmitting the cutoff frequency switching duration to the filter.

12. The device according to claim 11, wherein the decision circuit also sets the first cutoff frequency according to the DC offset value.

13. The device according to claim 9, wherein the second cutoff frequency is a cutoff frequency of the sound recording device in normal operation.

14. The device according to claim 9, wherein the sound recording device is a digital microphone.

* * * * *